(12) United States Patent
Fredrickson

(10) Patent No.: US 6,420,885 B1
(45) Date of Patent: Jul. 16, 2002

(54) SYSTEM AND APPARATUS FOR LOW-TEMPERATURE SEMICONDUCTOR DEVICE TESTING

(75) Inventor: Toby Alan Fredrickson, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/502,547

(22) Filed: Feb. 10, 2000

(51) Int. Cl.[7] .............................................. G01R 31/02
(52) U.S. Cl. ..................................................... 324/754
(58) Field of Search ................................ 324/754, 537, 324/755, 760, 765; 439/61, 66, 68, 71, 73, 482; 269/21, 97, 233; 165/80.1, 80.2, 80.3; 174/15.2; 257/719; 361/700; 279/3

(56) References Cited

U.S. PATENT DOCUMENTS 4,607,220 A * 8/1986 Hollman .................. 324/158 R
5,705,932 A * 1/1998 Fredrickson ................ 324/754

* cited by examiner

Primary Examiner—N. Le
Assistant Examiner—Etienne LeRoux
(74) Attorney, Agent, or Firm—Patrick T. Bever, Esq.; Edel M. Young

(57) ABSTRACT

A handler interface apparatus for low-temperature semiconductor device testing that includes a bracket and a handler board. The bracket including an outer frame, an inner frame connected to the outer frame by one or more arms, and a cover plate positioned over a central opening of the inner frame. When the handler board is mounted onto the bracket, conductors extending through the handler board from a device contactor pad are enclosed in a chamber formed by the handler board, the inner frame and the cover plate. The handler board is then mated to the test pins of a device tester, which extend through openings located between the inner frame, the outer frame, and the arms of the bracket. During low temperature testing, dry gas is pumped into the chamber through conduits formed in the arms of the bracket to prevent the condensation of moisture on the conductors located in the chamber. In a second disclosed embodiment, a cover plate is attached directly to a handler board.

10 Claims, 6 Drawing Sheets

SYSTEM AND APPARATUS FOR LOW-TEMPERATURE SEMICONDUCTOR DEVICE TESTING

FIELD OF THE INVENTION

The present invention relates to integrated circuit semiconductor device test systems, more particularly to a tester and handler interface apparatus that prevents condensation-related short-circuit problems associated with low-temperature semiconductor device testing.

BACKGROUND OF THE INVENTION

Low-temperature semiconductor device testing is often used to verify the conformance of a semiconductor device with military specifications. During low-temperature testing, semiconductor devices are placed in a handler containing a cool dry environment maintained at a temperature in the range of, e.g., 0° C. to −58° C. A handler board that includes a contact pad for receiving the cooled semiconductor devices is mounted over an opening in the handler. The handler presses the cooled semiconductor devices against a contact pad. A device tester then transmits test signals to the contact pad through conductive traces formed on the handler board, thereby applying the test signals to the cooled semiconductor devices.

FIG. 1 is an exploded perspective view showing a portion of a prior art low-temperature testing system that utilizes a handler interface described in U.S. Pat. No. 5,705,932, which is incorporated herein by reference. The prior art system generally includes a tester head 10, a handler 20, and a handler interface apparatus 30 that is connected between tester head 10 and handler 20 during low-temperature testing procedures.

Tester head 10 is located at the end of an adjustable arm 12 (partially shown) extending from a semiconductor device tester (not shown), which is an expensive piece of computing equipment for generating and receiving test signals. Wires extend up the adjustable arm from the device tester to a set of metal test pins 15 that extend from tester head 10. During test procedures, the wires are used to transmit test signals to test pins 15, and to transmit response signals received by test pins 15 from a device under test (DUT) to the semiconductor device tester.

Handler 20 includes an insulated box 21 connected to a cooling system, and a device handling mechanism mounted inside of insulated box 21. An opening 22 is provided in a side wall of insulated box 21 through which a contactor pad of handler interface apparatus 30 is exposed to the cool dry environment maintained inside insulated box 21. Device handling mechanism (not shown) is an expensive precise robot including an arm 22 for moving a DUT from a storage location to the contact pad during test procedures. The storage location is also located inside of insulated box 21 so that the DUTs are maintained at a desired low temperature throughout the test procedures.

Handler interface apparatus 30 includes a mother board 40, a handler board 50, and a coplanarity plate 60 that are sandwiched together and connected between test head 10 and handler 20 during low-temperature testing procedures.

Mother board 40 is a printed circuit board (PCB) including a set of test pin contacts 42 and a set of compressible pins 45. Test pin contacts 42 are arranged in groups that correspond to the arrangement of test pins 15 on tester head 10. Each test pin contact 42 includes a metal via that extends through mother board 40 to a corresponding plug located on a bottom surface (not shown) of mother board 40. These plugs are arranged to mate with test pins 15 (most commonly implemented by spring-biased pogo-pins). Compressible pins 45 (e.g., spring-biased pogo-pins) are also arranged in groups and extend from a front surface of mother board 40. Most compressible pins 45 are connected through metal traces (not shown) to corresponding vias of test pin contacts 42. Some compressible pins 45 are connected through corresponding test pin contacts 42 to individual test pins 15 of tester head 10. Some test pin contacts 42 and compressible pins 45 may be ganged together for carrying more current or applying the same signal to more than one compressible pin 45. Finally, threaded apertures (not shown) are spaced around mother board 40 to allow for alignment and connection to handler board 50 (alternatively, a cam lock can be used to connect mother board 40 to handler board 50).

Handler board 50 is also a PCB that includes a set of pin contacts 52 and a central contact pad 55. Pin contacts 52 are arranged in groups that correspond to the arrangement of compressible pins 45 on mother board 40. Each pin contact 52 includes a metal via that extends through handler board 50 to a corresponding contact structure located on a bottom surface (not shown) of handler board 50. These contact structures are arranged to receive the tips of compressible pins 45 when mother board 40 is connected to handler board 50. Contact pad 55 is centrally-located on a front surface of handler board 50, and is adapted to mount DUTs for testing by the device tester. Metallization traces (not shown) extend from pin contacts 52 to associated contact structures of contact pad 55, thereby providing signal paths used during testing procedures. Finally, alignment apertures (not shown) are spaced around handler board 50 to allow for alignment and connection to mother board 40.

Coplanarity plate 60 is a non-electrically conductive plate that provides a stand-off between mother board 40 and handler board 50. Coplanarity plate 60 produces equal compression of all the compressible pins 45 within a fixed range, prevents bending or buckling of the boards, and facilitates the flow of dry gas against a back surface of handler board 50 during low-temperature testing. Coplanarity plate 60 includes a series of outer openings 62, a central opening 65, and a series of radial grooves 67. Outer openings 62 are arranged such that, when coplanarity plate 60 is sandwiched between mother board 40 and handler board 50, the groups of compressible pins 45 on mother board 40 pass through outer openings 62 and press against pin contacts 52 of handler board 50. Central opening 65 is defined by an inner edge of coplanarity plate 60, and forms a dry air chamber when coplanarity plate,60 is sandwiched between mother board 40 and handler board 50. Radial grooves 67 extend along a front surface between the inner and outer edges of coplanarity plate 60. During low-temperature testing, dry air is forced through a selected groove 67 into the chamber defined by central opening 65 from a hose 70.

FIGS. 2(A) and 2(B) are top and side cross-sectional views showing prior art handler interface apparatus 30 in additional detail.

FIG. 2(A) shows the front surface of handler board 50, and indicates the various openings of coplanarity plate 60 in dashed lines. As indicated in FIG. 2(A), compressible pins 45 and pin contacts 52 are aligned with outer openings 62 of coplanarity plate 60. In addition, the dry air chamber defined by central opening 65 is located under contact pad 55 (including device contacts 57) that is mounted on the front surface of handler board 50. Finally, radial grooves 67(1) and 67(2) extend from the outer periphery of coplanarity plate 60 to the dry air chamber defined by central opening 65.

FIG. 2(B) is a cross-sectional view showing coplanarity plate 60 sandwiched between mother board 40 and handler board 50, thereby forming dry air chamber 80. Each compressible pin 45 extending from mother board 40 includes a tip 47 that presses against a pin receiving structure 53 of an associated pin contact 52 of handler board 50. Conductive traces extend along the back surface and through various layers of handler board 50 to contact structures 57 of contact pad 55, thereby providing electrical connections to a DUT (shown as a ball-grid array device).

During low temperature testing, the low temperature of the DUT can cause condensation to form on the back surface of handler board 50. The potential for condensation is particularly high on the back surface of handler board 50 opposite contact pad 55 because of the cold temperatures conducted along contact structures 57 from the cooled DUT. To avoid moisture condensation during low-temperature testing, dry gas is pumped through radial groove 67(1) into chamber 80. The dry gas is allowed to vent, for example, through radial groove 67(2).

A problem with prior art handler interface apparatus 30 is that it is very expensive to construct and maintain. Compressible (pogo) pins 45 are expensive and delicate, and hundreds must be painstakingly mounted and aligned on mother board 40, thereby making mother board 40 very expensive to produce. Damage to or impurities on any compressible pins 45 can result in testing contact errors, and identification and repair of damaged/dirty pins can be very time consuming. Moreover, handler interface apparatus 30 is difficult to assemble due to the required alignment of individual compressible pins 45 with pin receiving structures 53, and because of the collective force exerted by the hundreds of compressible pins 45. Further, handler interface apparatus 30 only supports the two board structure described above (i.e., with mother board 40 sandwiched with handler board 50).

What is needed is a low-cost, easily maintained handler interface apparatus that avoids the problems associated with prior art handler interface apparatus 30.

SUMMARY OF THE INVENTION

The present invention is directed to a handler interface apparatus that facilitates low-temperature semiconductor device testing using a single interface board. The handler interface apparatus provides direct contact between the test pins of a device tester and a handler board that is connected to a handler. A dry air chamber is provided over a back surface of the handler board to prevent moisture condensation that can cause electrical leakage and/or electrical short-circuiting that can produce erroneous test data.

In accordance with an embodiment of the present invention, a handler interface apparatus includes a special bracket for mounting a handler board. The bracket including an outer frame, an inner frame connected to the outer frame by two or more arms, and a cover plate positioned over a central opening provided through the inner frame. When the handler board is mounted onto the bracket, conductors extending through the handler board from a device contactor pad are enclosed in a chamber formed by a back surface of the handler board, the walls of the inner frame, and the cover plate.

During low-temperature testing, the handler interface apparatus is incorporated into a system that also includes a handler and a device tester. The bracket is used to secure the handler board to the handler such that the device handler pad is exposed to the cool dry environment contained therein. The handler board is then mated to the test pins of the device tester, which extend through openings located between the inner frame, the outer frame, and the arms of the bracket. Dry gas is pumped into the chamber through conduits formed in the arms of the bracket to prevent the condensation of moisture on the conductors located in the chamber.

In accordance with another embodiment of the present invention, a handler interface apparatus includes a cover plate mounted onto the back surface of a handler board. The cover plate is positioned over a central region of the handler board such that conductors extending through the handler board from a device contactor pad are enclosed in a chamber formed by a back surface of the handler board and the cover plate. During low-temperature testing, dry gas is pumped into the chamber through an opening formed in a wall of the cover plate to prevent the condensation of moisture on the conductors located in the chamber.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to a handler interface apparatus for low-temperature semiconductor device testing that overcomes some of the problems associated with the prior art handler interface apparatus (discussed above) by eliminating the mother board. Eliminating the mother board facilitates direct contact between the test pins of a device tester and the handler board. This direct contact eliminates the need for the compressible pins used on the mother board, thereby avoiding the test errors discussed above. Further, elimination of the expensive mother board greatly reduces the overall cost of the resulting apparatus.

Elimination of the mother board from the prior art handler interface apparatus produces gives rise to several problems that are addressed by the present invention. In particular, without the mother board, the back surface of the handler board is exposed to ambient atmosphere during low-temperature testing, thereby giving rise to moisture condensation that can result in electrical leakage and/or electrical short-circuiting. This condensation can also enter and damage the extremely expensive semiconductor testing device. The use of conformal coatings and non-conductive shields has been used with some success in postponing this condensation problem, but they serve only to delay the inevitable formation of condensation, or introduce other problems (e.g., impeding repairs). Heating the back surface of the handler plate has also been attempted, but heat conduction through the conductors of the contactor pad raise the temperature of the DUT, thereby rendering the low-temperature test invalid.

Figure 1:
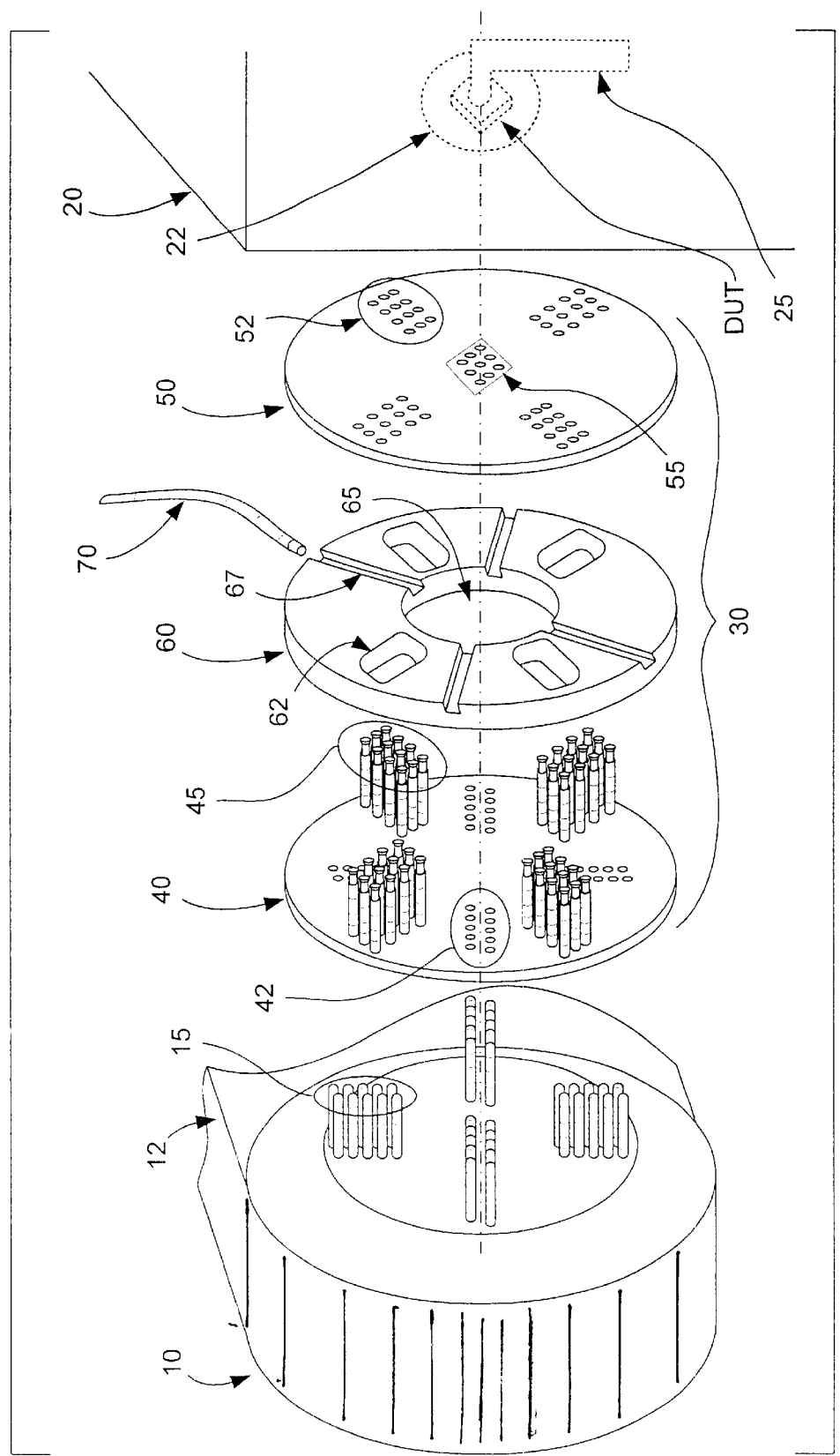
FIG. 1 is an exploded perspective view showing a portion of a prior art ATE system.
Figure 2A:
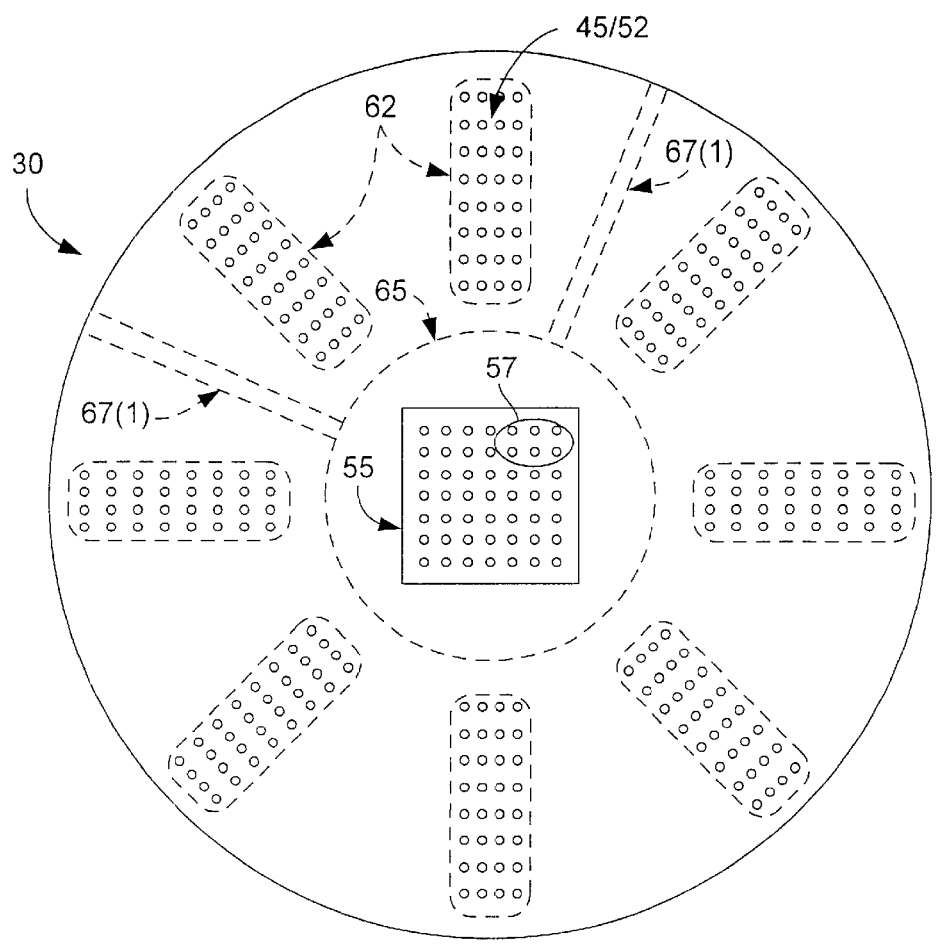
FIGS. 2(A) and 2(B) are top and side cross-sectional views showing a handler interface apparatus used in the prior art ATE system shown in FIG. 1.
Figure 2B:
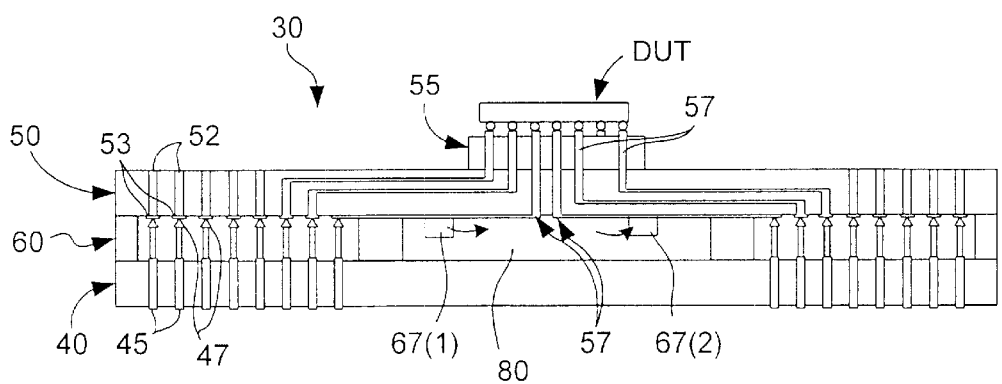
Figure 3:
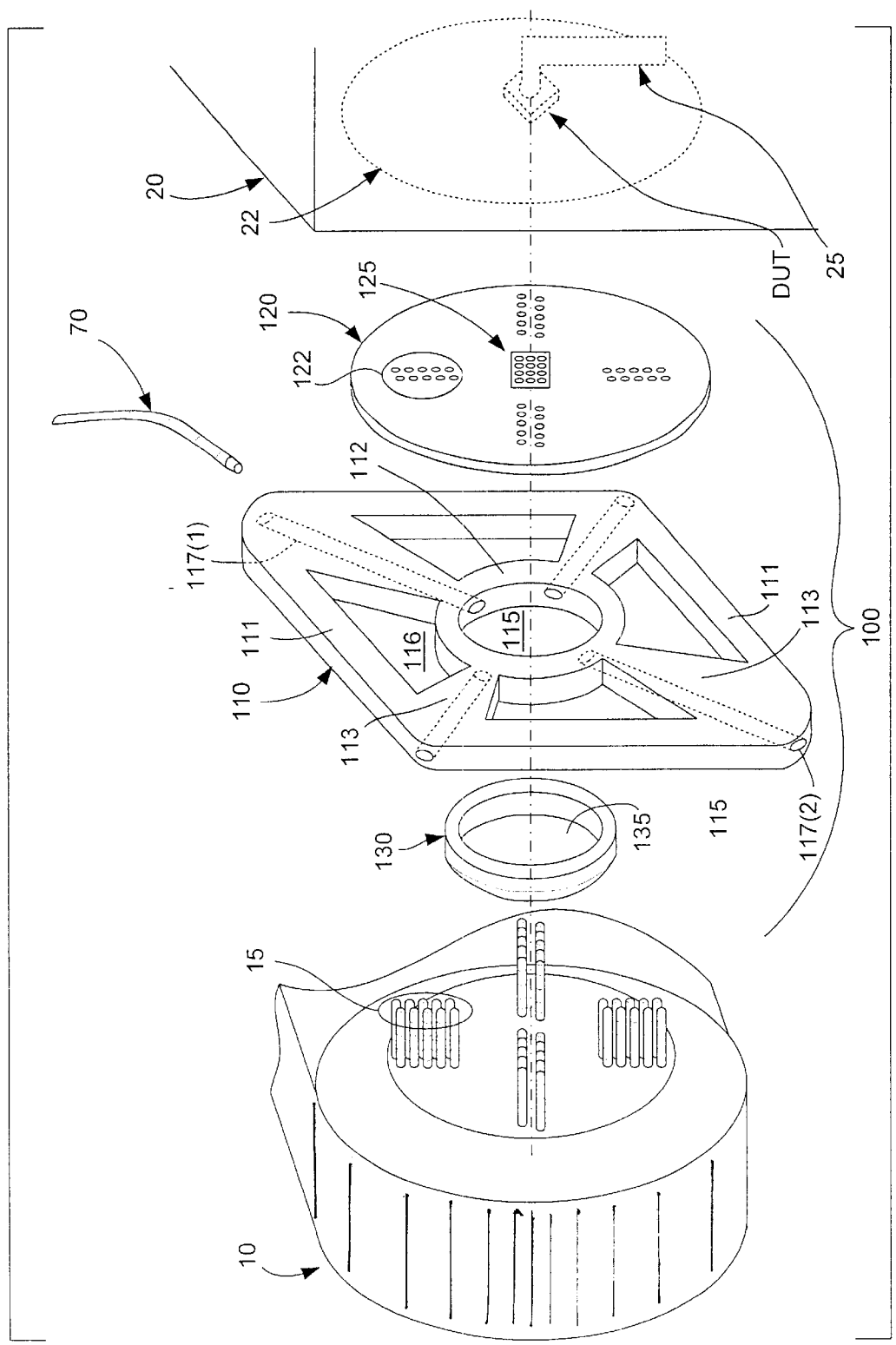
FIG. 3 is an exploded perspective view showing a portion of an ATE system according to a first embodiment of the present invention.

FIG. 3 is an exploded perspective view showing a portion of a low-temperature testing system in accordance with a first embodiment of the present invention. The system generally includes a tester head 10, a handler 20, and a handler interface apparatus 100 that is connected between tester head 10 and handler 20 during low-temperature testing procedures. Tester head 10 and handler 20 are described above.

Handler interface apparatus 100 includes a bracket 110, a handler board 120, and a cover plate 130. During low-temperature testing procedures, cover plate 130 covers a central opening formed in bracket 110, thereby providing a dry air chamber over a back surface of handler board 120 to prevent moisture condensation that can cause electrical leakage and/or electrical short-circuiting that can produce erroneous test data.

Handler board 120 is a PCB that includes a set of test pin contacts 122 and a device contactor pad 125. Test pin contacts 122 are arranged in groups that correspond to the arrangement of test pins 15 on tester head 10. Each test pin contact 122 includes a metal via that extends through handler board 120 to a corresponding contact structure located on a bottom surface (not shown) of handler board 120. These contact structures are arranged to receive test pins 15 when handler board 120 is connected to tester head 10. Device contact pad 125 is centrally-located on a front surface of handler board 120, and is adapted to mount DUTs to be tested by the device tester. Metallization (conductive) traces (not shown) extend from test pin contacts 122 to associated device contacts that extend through and are exposed on an upper surface of contact pad 125, thereby providing signal paths used during testing procedures.

Bracket 110 is provided to connect handler board 120 between tester head 10 and handler 20 during low-temperature testing. Bracket 110 includes an outer frame 111, an inner frame 112, and two or more arms 113 (four shown) extending radially from outer frame 111 to inner frame 112. Inner frame 112 surrounds a central opening 115. Outer openings 116 are defined by gaps provided between inner frame 111, outer frame 112, and arms 113. Conduits (e.g., 117(1) and 117(2)) extend between outer frame 111 and inner frame 112 through associated arms 113 to define passages for dry gas that is pumped into central opening 115 from supply hose 70 during low-temperature testing. Bracket 110 is machined from a rigid, non-electrically conductive material such as anodized aluminum.

Cover plate 130 is a disk or bowl-shaped piece formed from phenolic plastic or silicone that attaches onto inner frame 112 to cover central opening 115 of bracket 110.

Prior to low-temperature testing, handler interface apparatus 100 is assembled by mounting handler board 120 onto bracket 110, and attaching cover plate 130 onto inner frame 112 to cover central opening 115, thereby forming a dry gas chamber that is located opposite to device contactor pad 125. Handler interface apparatus 100 is then mounted onto handler 20 such that device contactor pad 125 is exposed through opening 22 to the cool dry atmosphere therein. Tester head 10 is then connected to handler interface apparatus 100 by inserting test pins 15 through outer openings 116 of bracket 110, and mating test pins 15 with test pin contacts 122 of handler board 120. Low-temperature testing is then performed using known techniques.

Figure 4A:
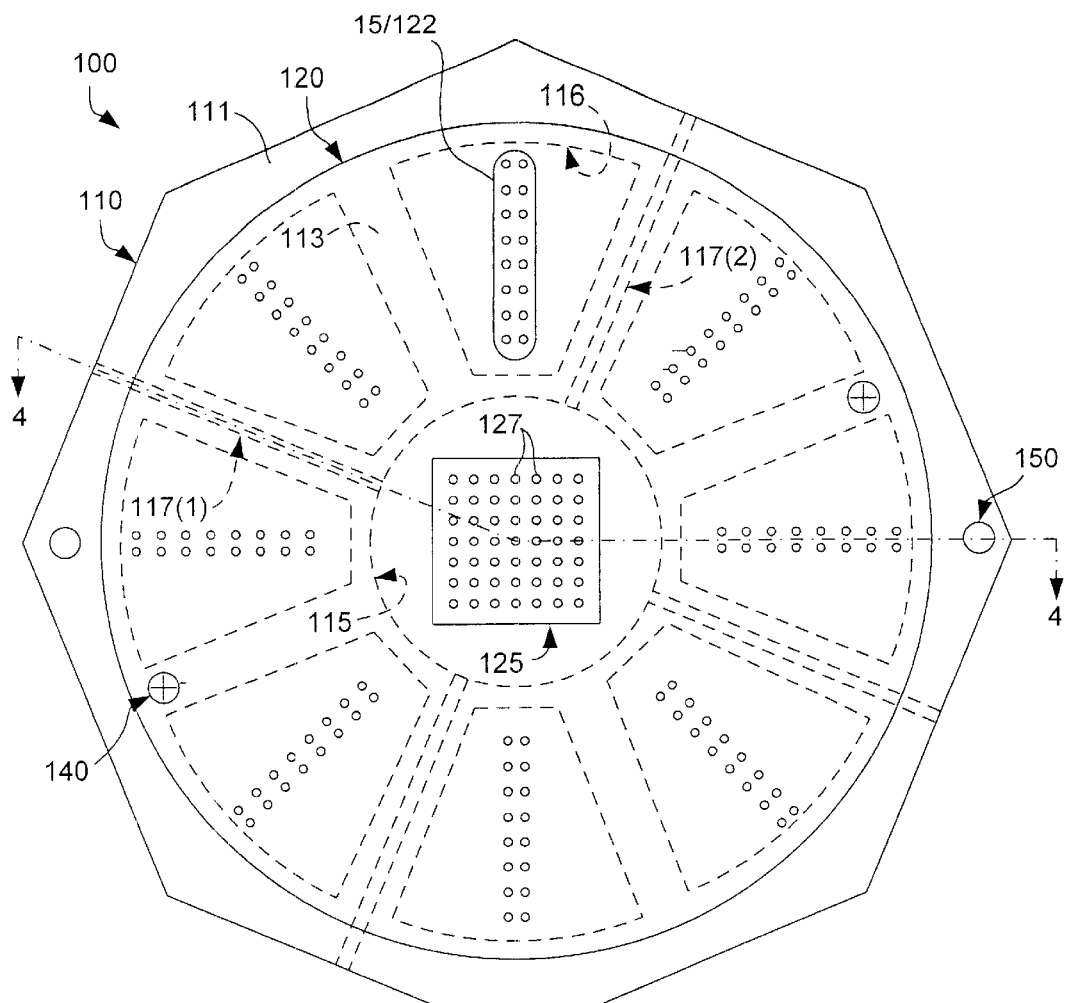
FIGS. 4(A) and 4(B) are top and side cross-sectional views showing a handler interface apparatus used in the ATE system shown in FIG. 3.
Figure 4B:
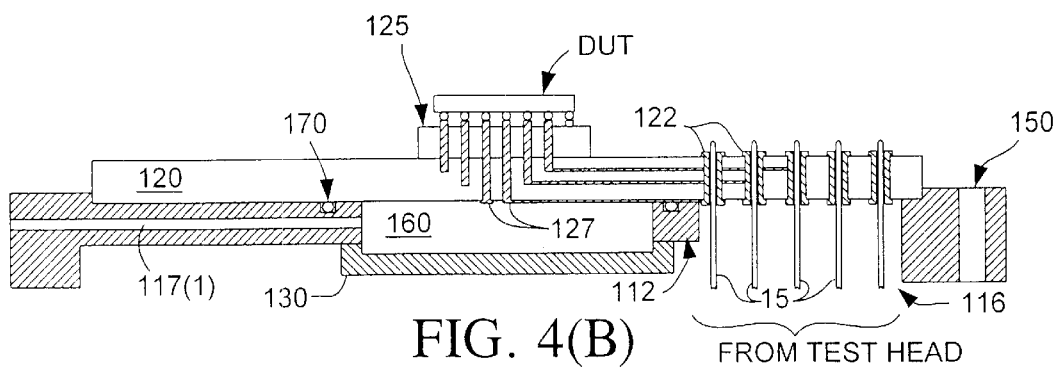

FIGS. 4(A) and 4(B) are top and side cross-sectional views showing handler interface apparatus 100 in additional detail. Note that bracket 110 is depicted as having an octagon-shaped outer frame 111 (in contrast to the square shape depicted in FIG. 3), thereby indicating that the shape of outer frame 111 can be altered without changing the functionality of bracket 110.

FIG. 4(A) shows the front surface of handler board 120, and indicates the various openings of bracket 110 in dashed lines. As indicated in FIG. 4(A), test pins 15 and test pin contacts 122 are aligned with outer openings 116 of bracket 110. In addition, the dry air chamber defined by central opening 115 is located under contact pad 125 (including device contacts 127) that is mounted on the front surface of handler board 120. Conduits 117(1) and 117(2) extend from outer frame 111 to the dry air chamber defined by central opening 115 along arms 113. In one embodiment, machine screws 140 are used to secure handler board 120 onto bracket 110. Finally, alignment holes 150 are provided through bracket 110 to facilitate connection to a device handler (not shown).

FIG. 4(B) is a cross-sectional view taken along section line 4—4 of FIG. 4(A) showing handler board 120 mounted onto outer frame 111 of bracket 120, and cover plate 130 mounted onto inner frame 112 of bracket 120, thereby forming a dry air chamber 160. Each test pin 15 extending from a tester head (not shown) is mated with an associated test pin contact 122 of handler board 120, which are exposed through outer openings 116 of bracket 110. Conductive traces extend along the back surface and through various layers of handler board 120 to device contact structures 127 of contact pad 125, thereby providing electrical connections to a DUT (shown as a ball-grid array device).

To avoid moisture condensation on the ends of device contact structures 127 (which are exposed inside of chamber 160) during low-temperature testing, dry gas is pumped through conduit 117(1) into chamber 160. Dry gas having a dew point of −100° C. is used, thereby allowing low-temperature testing at temperatures down to −100° C. The dry gas pumped into chamber 160 is allowed to vent, for example, through other conduits (not shown). Note that sealing structures 170, such as O-rings formed from silicone may be used to prevent introduction of the dry gas into the handler (not shown).

Handler interface apparatus 100 is significantly less expensive than the prior art handler interface apparatus (discussed above) because it eliminates the mother board by providing direct connection between handler board 120 and a device tester. Further, the handler interface apparatus of the present invention avoids condensation related test errors by providing a dry air chamber 160 formed by cover plate 130 and inner frame 112 of bracket 110.

Figure 5:
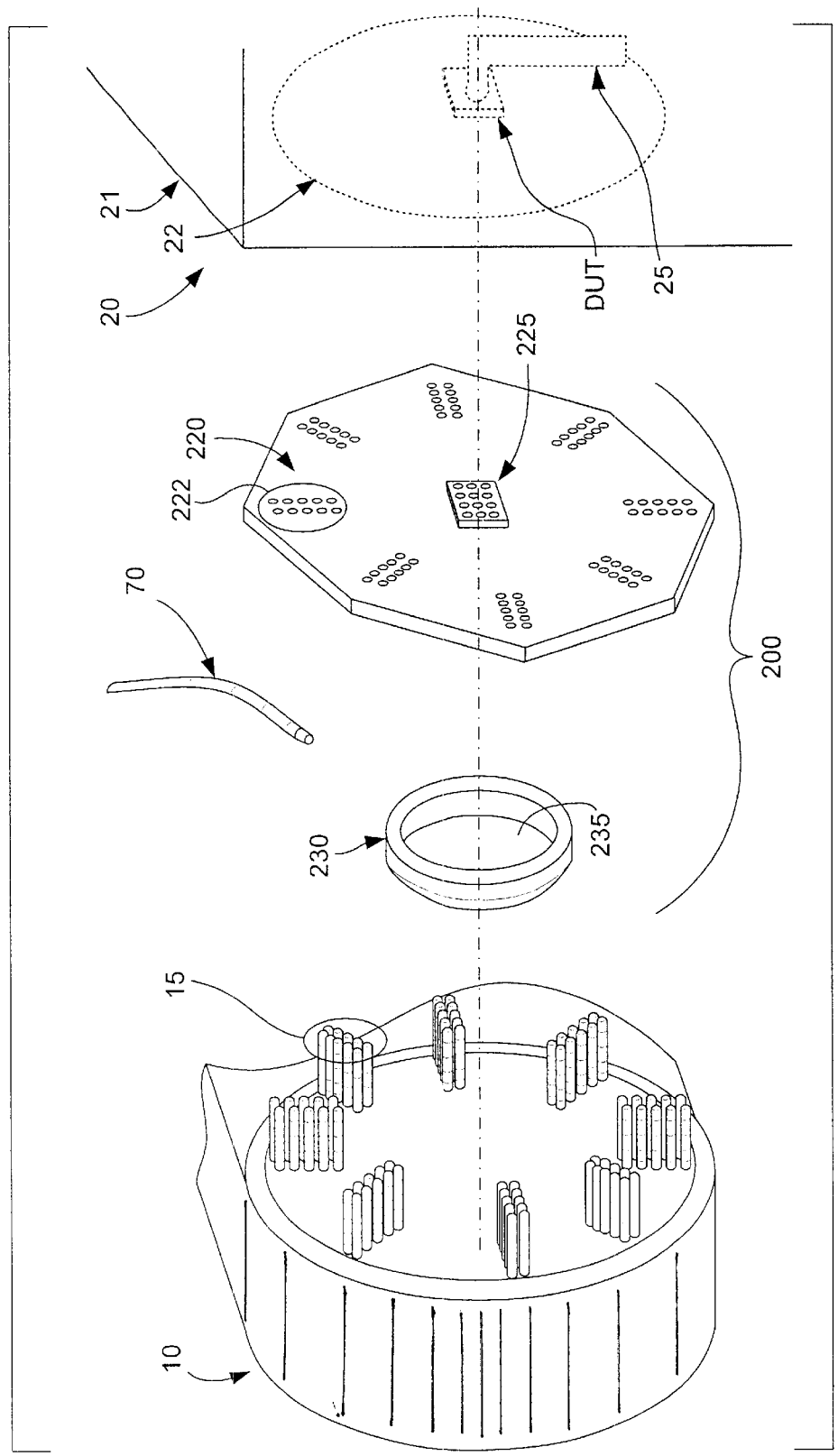
FIG. 5 is an exploded perspective view showing a portion of an ATE system according to a second embodiment of the present invention.

FIG. 5 is an exploded perspective view showing a portion of a low-temperature testing system in accordance with another embodiment of the present invention. In addition to tester head 10 and handler 20 (both described above), the system includes a handler interface apparatus 200 that is connected between tester head 10 and handler 20 during low-temperature testing procedures. Handler interface apparatus 200 includes a handler board 220 and a cover plate 230. Similar to cover plate 130 of the first embodiment (discussed above), cover plate 230 mounts over a central region of handler board 220, thereby providing a dry air chamber over a back surface of handler board 220 to prevent moisture condensation that can cause electrical leakage and/or electrical short-circuiting. However, unlike the first embodiment, cover plate 230 is mounted directly onto handler board 220 (i.e., instead of onto a bracket).

As in the first embodiment, handler board 220 is a PCB that includes a set of test pin contacts 222 and a device contactor pad 225. Test pin contacts 222 are arranged in groups that correspond to the arrangement of test pins 15 on tester head 10. Device contact pad 225 is centrally-located on a front surface of handler board 220, and is adapted to mount DUTs to be tested by the device tester. Metallization traces (not shown) extend from test pin contacts 222 to associated device contacts that extend through and are exposed on an upper surface of contact pad 225, thereby providing signal paths used during testing procedures.

Cover plate 230 is a disk or bowl-shaped piece formed from phenolic plastic or silicone that attaches onto handler board 220 using, for example, a suitable adhesive or fastener.

Prior to low-temperature testing, handler interface apparatus 100 is assembled by attaching cover plate 230 onto handler board 220, thereby forming a dry gas chamber that is located opposite to device contactor pad 225. Handler board 220 is then mounted onto handler 20 such that device contactor pad 225 extends through opening 22 into insulated box 21. Tester head 10 is then connected to handler interface apparatus 200 by mating test pins 15 to pin contacts 222 of handler board 220.

Figure 6A:
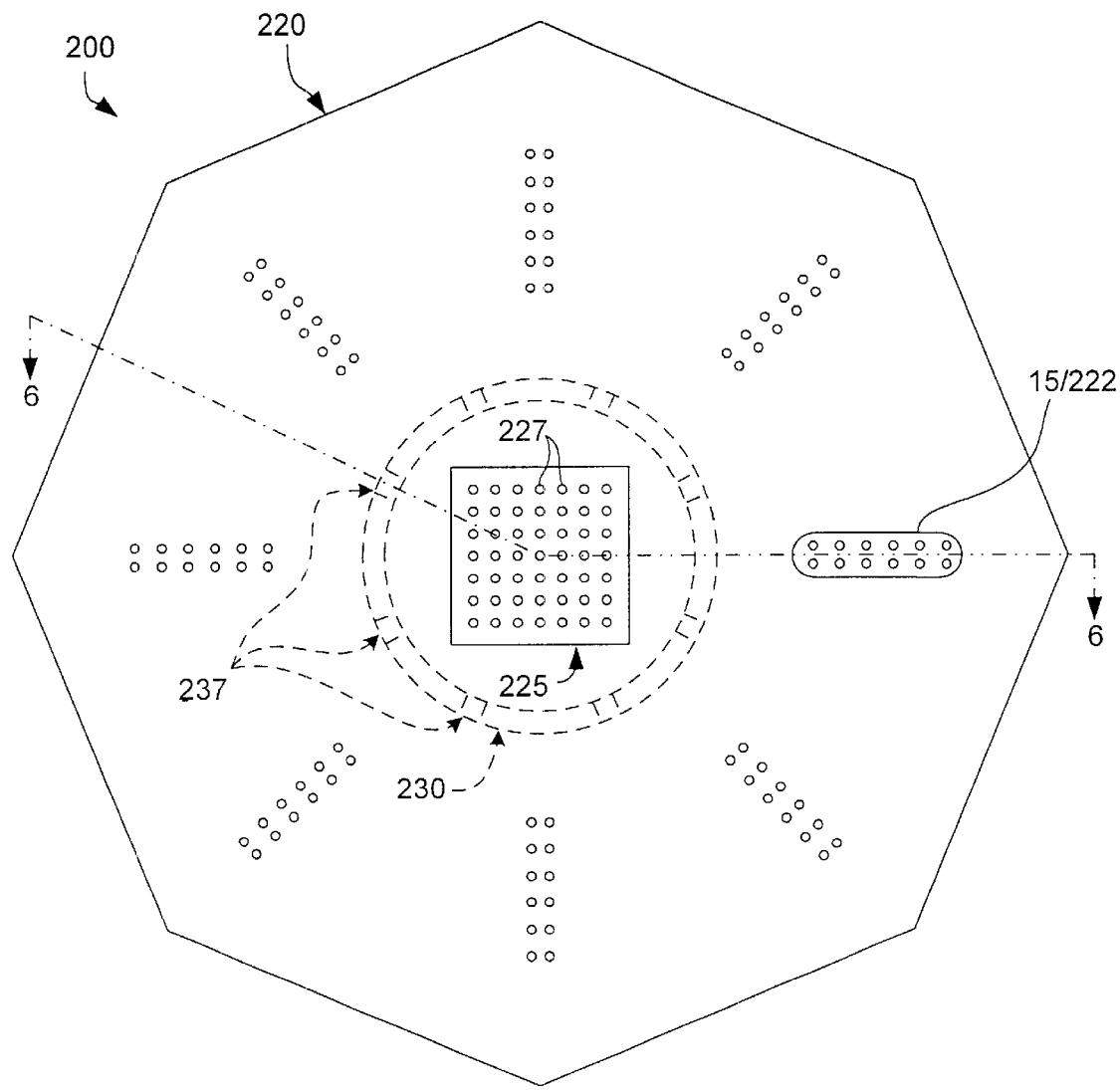
FIGS. 6(A) and 6(B) are top and side cross-sectional views showing a handler interface apparatus used in the ATE system shown in FIG. 5.
Figure 6B:
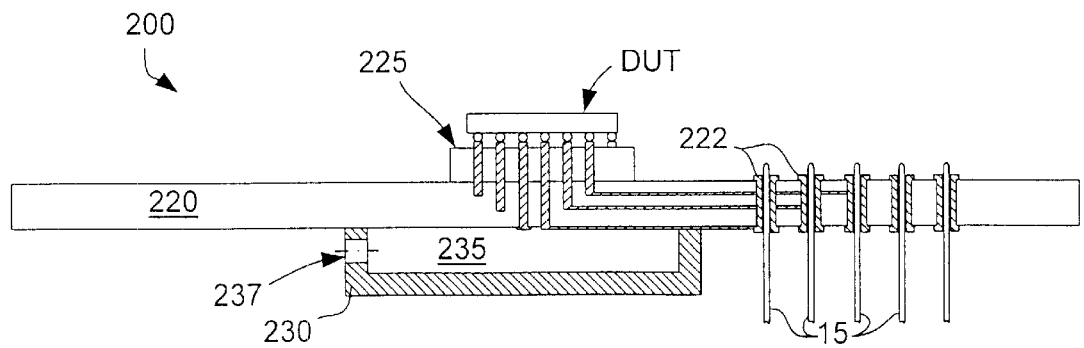

FIGS. 6(A) and 6(B) are top and side cross-sectional views showing handler interface apparatus 200 in additional detail.

FIG. 6(A) shows the front surface of handler board 220, and indicates that the dry air chamber is located under contact pad 225 (including device contacts 227) that is mounted on the front surface of handler board 220. Openings 237 extend through the sides of cover plate 230.

FIG. 6(B) is a cross-sectional view taken along section line 6—6 of FIG. 6(A) showing cover plate 230 mounted onto handler board 220, thereby forming a dry air chamber 235. Each test pin 15 extending from a tester head (not shown) is mated with an associated test pin contact 222 of handler board 220. Conductive traces extend along the back surface and through various layers of handler board 220 to device contact structures 227 of contact pad 225, thereby providing electrical connections to a DUT. To avoid moisture condensation on the ends of device contact structures 227 (which are exposed inside of chamber 235) during low-temperature testing, dry gas is pumped through a selected conduit 237 into chamber 235, and is allowed to vent through other conduits 237 (see FIG. 6(A)).

Similar to handler interface apparatus 100 (discussed above), handler interface apparatus 200 of the present invention avoids condensation related test errors by providing a dry air chamber 235 formed by cover plate 230 and handler board 220. However, the handler interface apparatus of the present embodiment is less expensive than handler interface apparatus 100 (discussed above) because it eliminates the machining costs associated with bracket 110.

Although the present invention has been described with respect to certain specific embodiments, it will be clear to those skilled in the art that the inventive features of the present invention are applicable to other embodiments as well. For example, cover plate 130 can be integrally formed with bracket 110 (i.e., machined from a single piece of material). In addition, conduits 117 can be partially formed by grooves, such as those used in the disclosed prior art. These and other embodiments are intended to fall within the scope of the present invention.

I claim:

1. An apparatus for low-temperature semiconductor device testing comprising:
   a handler board including a plurality of test pin contacts, a device contactor pad including a plurality of device contacts, and a plurality of conductive traces connected between the test pin contacts and the device contacts, wherein the device contactor pad is located on a front surface of the handler board and the plurality of device contacts extend through the handler board and include portions exposed in a central region on a back surface of the handler board;
   a cover plate located behind a back surface of the handler board and located over the central region, and shaped to form, in combination with the handler board, a chamber capable of holding dry gas; and
   wherein the exposed portions of the device contacts are located inside of the chamber.

2. The apparatus according to claim 1, wherein a plurality of openings are formed in the cover plate.

3. The apparatus according to claim 1, further comprising a bracket connected between the handler board and the cover plate, the bracket including:
   an outer frame;
   an inner frame defining a central opening; and a plurality of arms extending from the outer frame to the inner frame, wherein the chamber is formed by a portion of the handler board, the central opening defined by the inner frame, and the cover plate.

4. The apparatus according to claim 3, wherein a plurality of conduits are defined from the outer frame to the central opening through the arms and inner frame of the bracket.

5. The apparatus according to claim 3, wherein a plurality of outer openings are defined between the arms of the bracket, and the plurality of test pin contacts are exposed on the back surface of the handler board through the plurality of outer openings.

6. The apparatus according to claim 3, wherein the cover plate is removably connected to the inner frame of the bracket.

7. The apparatus according to claim 3, wherein the cover plate is integrally formed with and connected to the inner frame of the bracket.

8. An apparatus for low-temperature semiconductor device testing comprising:

a handler board including a plurality of test pin contacts, a device contactor pad including a plurality of device contacts, and a plurality of conductive traces connected between the test pin contacts and the device contacts, wherein the device contactor pad is located on a front surface of the handler board and the plurality of device contacts extend through the handler board and include portions exposed on a back surface of the handler board;

a cover plate;

a bracket connected between the handler board and the cover plate, the bracket including:

an outer frame;

an inner frame defining a central opening; and a plurality of arms extending from the outer frame to the inner frame, wherein a chamber capable of holding dry gas is formed by the cover plate, a portion of the handler board, and the central opening defined by the inner frame, wherein the exposed portions of the device contacts are located inside the chamber.

9. The apparatus according to claim 8, wherein a plurality of conduits are defined from the outer frame to the central opening through the arms and inner frame of the bracket.

10. The apparatus according to claim 8, wherein a plurality of outer openings are defined between the arms of the bracket, and the plurality of test pin contacts are exposed on the back surface of the handler board through the plurality of outer openings.

* * * * *